(12) United States Patent
Lin et al.

(10) Patent No.: US 11,917,886 B2
(45) Date of Patent: *Feb. 27, 2024

(54) ELECTRONIC DEVICE

(71) Applicant: InnoLux Corporation, Miao-Li County (TW)

(72) Inventors: Hsiao-Lang Lin, Miao-Li County (TW); Jui-Jen Yueh, Miao-Li County (TW); Kuan-Feng Lee, Miao-Li County (TW); Jia-Yuan Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/113,614

(22) Filed: Feb. 23, 2023

(65) Prior Publication Data

US 2023/0209963 A1 Jun. 29, 2023

Related U.S. Application Data

(63) Continuation of application No. 17/569,518, filed on Jan. 6, 2022, now Pat. No. 11,626,454, which is a continuation of application No. 16/698,965, filed on Nov. 28, 2019, now Pat. No. 11,251,234, which is a continuation of application No. 15/623,402, filed on Jun. 15, 2017, now Pat. No. 10,529,783.

(60) Provisional application No. 62/479,326, filed on Mar. 31, 2017, provisional application No. 62/462,999, filed on Feb. 24, 2017.

(51) Int. Cl.
| | |
|---|---|
| *H10K 59/38* | (2023.01) |
| *H01L 33/06* | (2010.01) |
| *G02B 5/30* | (2006.01) |
| *H01L 25/075* | (2006.01) |
| *G02F 1/13357* | (2006.01) |
| *G02F 1/1335* | (2006.01) |
| *H01L 33/50* | (2010.01) |

(52) U.S. Cl.
CPC .......... *H10K 59/38* (2023.02); *G02B 5/3041* (2013.01); *G02F 1/1336* (2013.01); *G02F 1/133528* (2013.01); *G02F 1/133621* (2013.01); *H01L 25/0753* (2013.01); *H01L 33/06* (2013.01); *G02F 1/133614* (2021.01); *G02F 2202/36* (2013.01); *H01L 33/504* (2013.01)

(58) Field of Classification Search
None
See application file for complete search history.

*Primary Examiner* — Lucy P Chien
(74) *Attorney, Agent, or Firm* — Winston Hsu

(57) ABSTRACT

An electronic device includes a light emitting diode and a light converting layer disposed on the light emitting diode. The electronic device emits a green output light under an operation of a highest brightness. The green output light has an output spectrum. An intensity integral of the output spectrum from 380 nm to 489 nm is defined as a first intensity integral. An intensity integral of the output spectrum from 490 nm to 780 nm is defined as a second intensity integral. A ratio of the first intensity integral over the second intensity integral is defined as a first ratio, and the first ratio is greater than 0% and less than or equal to 7.5%.

12 Claims, 9 Drawing Sheets

ELECTRONIC DEVICE

CROSS REFERENCE TO RELATED APPLICATIONS

This application is a continuation application of U.S. application Ser. No. 17/569,518, filed on Jan. 6, 2022, which is a continuation application of U.S. application Ser. No. 16/698,965, filed on Nov. 28, 2019, which is a continuation application of U.S. application Ser. No. 15/623,402, filed on Jun. 15, 2017, which claims the benefit of U.S. Provisional Application No. 62/462,999, filed on Feb. 24, 2017, and claims the benefit of U.S. Provisional Application No. 62/479,326, filed on Mar. 31, 2017. The contents of these applications are incorporated herein by reference.

BACKGROUND OF THE DISCLOSURE

1. Field of the Disclosure

The present disclosure relates to a display device, and more particularly to a display device capable of generating green light which has a color close to the green primary color of DCI-P3 color gamut.

2. Description of the Prior Art

Display devices are configured to convert acquired or stored electric information into visual information and display it to a user. The color gamut of display devices, such as cathode ray tube (CRT) display and liquid crystal display (LCD), are referenced to NTSC (National Television System Committee) color gamut. With the advance of technology, in order to meet different color systems and display various colors, different color gamuts, such as sRGB, DCI (Digital Cinema Initiatives)-P3 and Rec. 2020 (ITU-R Recommendation BT.2020), have been defined. The DCI-P3 color gamut is one of the popular color gamuts and is widely applied to various digital monitors or TV.

However, the color temperature of the white light generated from a digital monitor, such as a laptop computer monitor or a desktop computer monitor, is usually yellower than that generated from a TV, thereby resulting in less preferred images displayed by the digital monitor. The traditional method for adjusting color temperature or color tone is to change the spectrum of the light generated from a light-emitting material, which is complicated and also takes much time, thereby burdening the manufacturing cost.

SUMMARY OF THE DISCLOSURE

According to an embodiment of the present disclosure, an electronic device is provided. The electronic device includes a light emitting diode and a light converting layer disposed on the light emitting diode. The electronic device emits a green output light under an operation of a highest brightness. The green output light has an output spectrum. An intensity integral of the output spectrum from 380 nm to 489 nm is defined as a first intensity integral. An intensity integral of the output spectrum from 490 nm to 780 nm is defined as a second intensity integral. A ratio of the first intensity integral over the second intensity integral is defined as a first ratio, and the first ratio is greater than 0% and less than or equal to 7.5%.

According to another embodiment of present disclosure, an electronic device is provided. The electronic device includes a light emitting diode and a light converting layer disposed on the light emitting diode. The electronic device emits an output light under an operation of a highest brightness. The output light has an output spectrum. The output spectrum includes a first intensity peak and a second intensity peak, wherein the first intensity peak is a maximum peak of the output spectrum between 380 nm to 489 nm, and the second intensity peak is a maximum peak of the output spectrum between 490 nm to 780 nm. A ratio of the first intensity peak over the second intensity peak is defined as a second ratio, and the second ratio is greater than 0% and less than or equal to 10.0%.

According to another embodiment of the present disclosure, a display device is provided. The display device includes a display unit. The display unit includes a light emitting unit and a light converting layer disposed on the light emitting unit. The display unit emits a green output light under an operation of a highest gray level. The green output light has an output spectrum, wherein an intensity integral of the output spectrum from 380 nm to 489 nm is defined as a first intensity integral, an intensity integral of the output spectrum from 490 nm to 780 nm is defined as a second intensity integral, a ratio of the first intensity integral over the second intensity integral is defined as a first ratio, and the first ratio is greater than 0% and less than or equal to 7.5%.

According to another embodiment of the present disclosure, a display device is provided. The display device includes a display unit. The display unit includes a light emitting unit and a light converting layer disposed on the light emitting unit. The display unit emits an output light under an operation of a highest gray level. The output light has an output spectrum. The output spectrum comprises a first intensity peak and a second intensity peak, wherein the first intensity peak is a maximum peak of the output spectrum between 380 nm to 489 nm, the second intensity peak is a maximum peak of the output spectrum between 490 nm to 780 nm, a ratio of the first intensity peak over the second intensity peak defines as a second ratio, and the second ratio is greater than 0% and less than or equal to 10.0%.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity, certain elements in various drawings may not be drawn to scale.

It will be understood that when an element is referred to as being "on" another layer or substrate, it can be directly on the other element, or intervening elements may also be present. It will be understood that, although the terms first, second, third etc. may be used herein to describe various elements, components, sub-pixels, units, and/or layers, these elements, components, sub-pixels, units and/or layers should not be limited by these terms. These terms are used to distinguish one element, component, sub-pixel, unit and/or layer from another element, component, sub-pixel, unit and/or layer.

Figure 1:
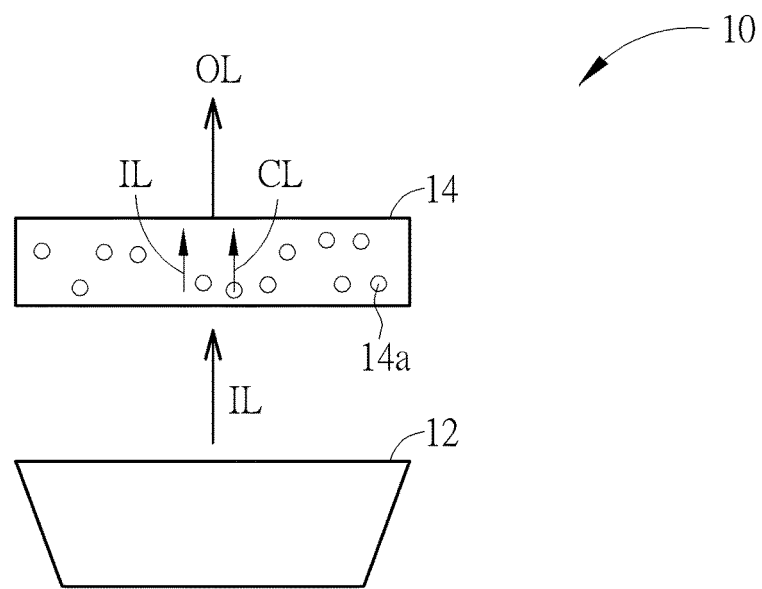
FIG. 1 is a sectional-view schematic diagram illustrating a display device according to a first embodiment of the present disclosure.

Referring to FIG. 1, FIG. 1 is a sectional-view schematic diagram illustrating a display unit of a display device according to a first embodiment of the present disclosure. The display unit of the display device 10 includes a light emitting unit 12 and a light converting layer 14 disposed on the light emitting unit 12. The display unit could emit an output light OL. The light converting layer 14 can convert the input light IL (with input spectrum) into the output light OL (with output spectrum). In the display unit of the display device 10, an input light IL with an input color emitted from the light emitting unit 12 enters the light converting layer 14, and the light converting layer 14 absorbs a part of the input light IL and converts the part of the input light IL into a converted light CL with a converted color different from the input color. Other part of the input light IL that is not absorbed by the light converting layer 14 will penetrate through the light converting layer 14. Accordingly, the converted light CL and the other part of the input light IL is mixed with each other to form the output light OL. Therefore, the output light OL is emitted from the light-emitting surface of the light converting layer 14, and the output color of the output light OL is a mixture color of the input color of the input light IL and the converted color of the converted light CL. In this embodiment, the main wavelength range of the input light IL is less than the main wavelength range of the converted light CL. Furthermore, the output light OL has an output spectrum under an operation of a highest gray level. For example, for an 8-bit-deep image, the highest gray level may be 255, but not limited thereto.

In this embodiment, the light emitting unit 12 may include a self-emissive blue light emitting diode (LED), such as micro-sized LED (inorganic, called micro-LED) or organic light emitting diode (OLED), and the input light IL emitted from the light emitting unit 12 can be directly turned on or off by a switch electrically connected to the light emitting unit 12, such as thin-film transistor (TFT), but not limited thereto. However, the light emitting unit 12 may be other kinds of self-emissive LEDs or non-self-emissive light sources. Also, the number of the micro-LED in the light emitting unit 12 is not limited, which may be one or plural. For example, the display device 10 may include a substrate with a concavity, and one or more micro-LEDs generating the same spectrum may be disposed in the concavity since the size of the micro LEDs is about micrometer-scale or smaller. In this embodiment, the input light IL has a spectrum with a wave, which will be mentioned as "input spectrum" hereinafter. The wave of the input spectrum ranges from about 380 nm to about 489 nm, and the wave of the input spectrum has an intensity peak (local maximum intensity) and a full width at half maximum (FWHM) value, wherein the intensity peak is for example ranges from 447 nm to 449 nm, and the FWHM may range from 10 nm to 30 nm, for example ranges from 17 nm to 19 nm.

The light converting layer 14 may include a quantum dot material, a color filter material or a phosphor material, or combination of at least two of those materials. When the light converting layer 14 includes the quantum dot material, the light converting layer 14 may include a plurality of quantum dots 14a. The quantum dot material is made of a semiconductor nano-crystal structure, and can be any one or more selected from CdSe, CdS, CdTe, ZnSe, ZnTe, ZnS, HgTe, InAs, Cd1-xZnxSe1-ySy, CdSe/ZnS, InP, and GaAs.

Figure 2:
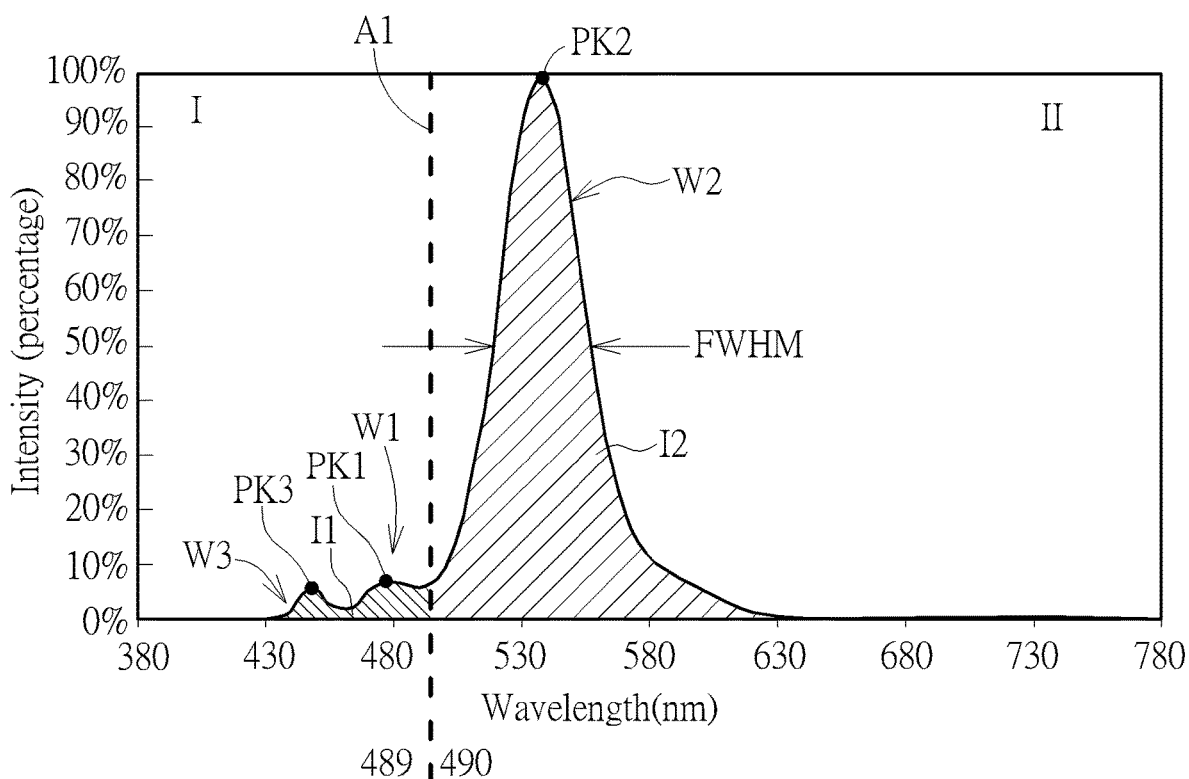
FIG. 2 is a schematic diagram illustrating an output spectrum of the output light of the display device of the present disclosure.

Referring to FIG. 2, FIG. 2 is a schematic diagram illustrating an output spectrum of the output light OL of the display device 10 of the present disclosure. Since the output light OL is emitted by mixing the converted light CL with the converted color and the other part of the input light IL with the input color, the output spectrum of the output light OL may include at least two waves, wherein one of the waves corresponds to the wave of the input spectrum, and the other one corresponds to the wave of the spectrum of the converted light CL. In this embodiment, the output spectrum of the output light OL has a first wave W1 (sub), a second wave W2 (main), and a third wave W3 (sub). The first wave W1 and the third wave W3 may represent the other part of the input light IL that penetrates through the light converting layer 14, and fall in the range from 380 nm to 489 nm, as shown in the portion I in the spectrum diagram in FIG. 2. In this embodiment, the first wave W1 has a first intensity peak PK1 that is a maximum peak of the output spectrum from 380 nm to 489 nm, and the third wave W3 has a third intensity peak PK3 with the intensity less than the first intensity peak PK1, wherein the third intensity peak PK3 is at about 448 nm and corresponds to the intensity peak of the input spectrum of the input light IL as mentioned above, but not limited thereto. Because a large part of the input light IL is absorbed by the light converting layer 14, the first intensity peak PK1 with the maximum intensity in 380 nm to 489 nm is slightly different from the intensity peak of the input spectrum and is at about 478 nm. The second wave W2 represents the converted light CL generated from the light converting layer 14 and is in a range from about 490 nm to about 780 nm, as shown in the portion II in the spectrum diagram in FIG. 2. The second wave W2 has a second intensity peak PK2 that is a maximum peak of the output spectrum from 490 nm to 780 nm and falls in the wavelength ranges from 535 nm to 540 nm. A lead line A1, between 489 nm and 490 nm, represents the boundary of the portion I and the portion II in the spectrum diagram in FIG. 2. Since a large part of the input light IL is absorbed by the light converting layer 14, the intensity of the second intensity peak PK2 is much greater than the intensity of the first intensity peak PK1, and the output color of the output light OL can be similar to but not the same as the green converted color of the converted light CL. Also, through having the first wave W1 and the third wave W3 with less intensity, the output color may be slightly bluish. In this embodiment, the green color of the second wave W2 is not mixed with other color except the blue color of the first wave W1 and the third wave W3.

Specifically, an intensity integral of the output spectrum from 380 nm to 489 nm, which is the intensity integral of the first wave W1 and the third wave W3, defines as a first intensity integral I1. The first intensity integral I1 may represent the energy of the other part of the input light IL that is not absorbed by the light converting layer 14. An intensity integral of the output spectrum from 490 nm to 780 nm, which is the intensity integral of the second wave W2, defines as a second intensity integral I2. The second intensity integral I2 may represent the energy of the converted light CL. A ratio of the first intensity integral I1 over the second intensity integral I2 in the output spectrum defines as a first ratio (I1/I2). The output color of the output light OL can be determined based on the first ratio. In this embodiment, the first ratio is greater than 0% and less than or equal to 7.5%. Furthermore, a ratio of the first intensity peak PK1 over the second intensity peak PK2 defines as a second ratio (PK1/PK2), and the second ratio can be greater than 0% and less than or equal to 10.0%. The wavelengths of the second wave W2 at the FWHM may range from about 519 nm and about 556 nm, so that the FWHM of the second wave W2 may be for example 38 nm. When the light converting layer 14 includes the quantum dots 14a for converting blue light into green light, the size of each quantum dot 14a may for example range from about 2 nm to about 4 nm.

Figure 3:
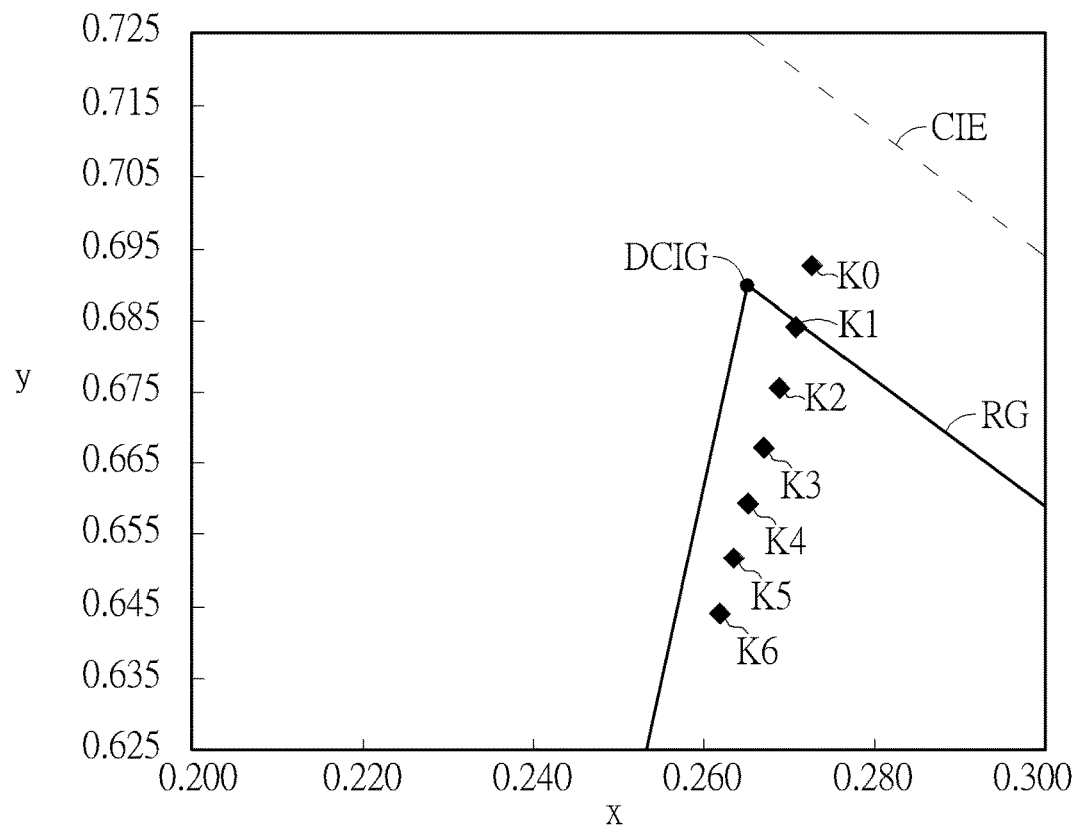
FIG. 3 is a chromaticity diagram illustrating points of output spectrums of output lights with different first ratios and different second ratios.

Refer to FIG. 3 and Table 1, FIG. 3 is a chromaticity diagram illustrating points of the output spectrums of the output lights with different first ratios and different second ratios, wherein the DCI-P3 color gamut and the CIE 1931 color space are also shown in the diagram. The first ratios and the corresponding second ratios are listed in the following Table 1. The curve CIE represents a boundary of the CIE 1931 color space, and the region RG represents the DCI-P3 color gamut, in which the point DCIG represents the green primary color thereof of the DCI-P3. The point K0 represents the color of the second wave W2 with no first wave W1 and third wave W3, and therefore the point K0 is close to the point DCIG enough to show almost the same color as the point DCIG, the green primary color. In addition, the point K1 represents the condition of the first ratio being 1.1%; the point K2 represents the condition of the first ratio being 2.2%; the point K3 represents the condition of the first ratio being 3.3%; the point K4 represents the condition of the first ratio being 4.4%; the point K5 represents the condition of the first ratio being 5.5%; and the point K6 represents the condition of the first ratio being 6.6%. Based on the above description, when the first ratio is greater than 0% and less than or equal to 7.5% or the second ratio is greater than 0% and less than or equal to 10%, the color of the points K1 to K6 may be adjusted to be slightly bluish, and at the same time, the color of the points K1 to K6 is still close to the point DCIG enough to be used as a green light source, such as a green sub-pixel. It should be noted that because the first wave W1 and the third wave W3 are from the input light, the output color of the output light OL can be adjusted to be slightly bluish to match the requirements for the user or the end product. For example, when the display device 10 is used as a light emitting cell in the green sub-pixel of a color display source, the white color generated from the red sub-pixel, the blue sub-pixel and the green sub-pixel of the color display source can be slightly shifted to be bluish, thereby increasing the color temperature thereof. Accordingly, the color temperature of the color display source or apparatus adopting the display device 10 can be the same as the color temperature generated from the TV by adjusting the first ratio so as to improve the visual perception of the user. In another aspect, the display device 10 itself may be used as a display source for emitting single color, such as the green display source in a projector, and the end image outputted by the projector with the combination of the images produced by the display device 10 and other color display devices may also have a greater color temperature.

TABLE 1

Output spectrums of the output lights with different first ratios and different second ratios

| Point | K6 | K5 | K4 | K3 | K2 | K1 | K0 |
|---|---|---|---|---|---|---|---|
| First ratio | 6.6% | 5.5% | 4.4% | 3.3% | 2.2% | 1.1% | 0.0% |
| Second ratio | 8.9% | 7.4% | 6.0% | 4.5% | 3.0% | 1.5% | 0.0% |
| x | 0.262 | 0.264 | 0.265 | 0.267 | 0.269 | 0.271 | 0.273 |
| y | 0.644 | 0.652 | 0.659 | 0.667 | 0.676 | 0.684 | 0.693 |
| Δx | −0.003 | −0.001 | −0.000 | −0.002 | 0.004 | 0.006 | 0.008 |
| Δy | −0.046 | −0.038 | −0.031 | −0.023 | −0.014 | −0.006 | 0.003 |

Figure 4:
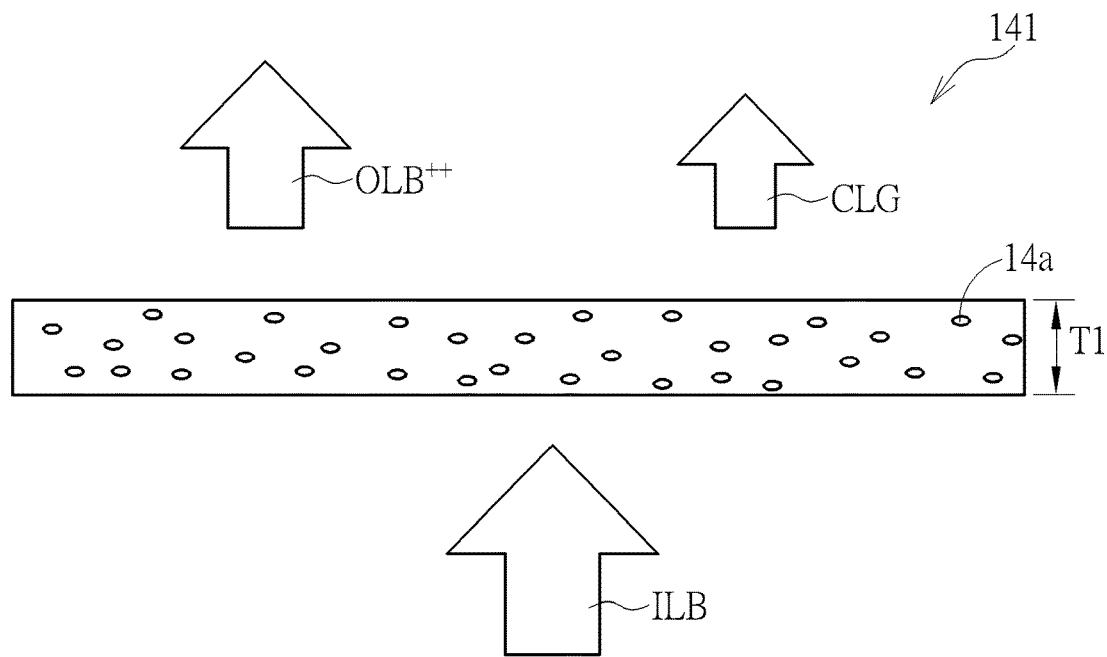
FIG. 4 is a sectional-view schematic diagram of a first exemplified variant of the light converting layer shown in FIG. 1 according to the first embodiment of the present disclosure

Referring to FIG. 4, FIG. 4 is a sectional-view schematic diagram of a first exemplified variant of the light converting layer shown in FIG. 1 according to the first embodiment of the present disclosure, which explains the light conversion mechanism of the exemplified light converting layer 141. In FIG. 4, as well as in FIG. 5 to FIG. 7, the sizes of the arrows respectively represent the light intensity. The arrow marked by "ILB" represents the intensity of the blue input light, which is the input light IL in FIG. 1, the arrow marked by "CLG" represents the intensity of the green converted light, which is the converted light CL in FIG. 1, and the arrow marked by "OLB$^{++}$" represents the intensity of the blue output light (or called as blue-light leakage), which is the other part of the input light IL not absorbed by the light converting layer 14. The light converting layer 141 includes quantum dots 14a which can convert blue light into green light. Therefore, the concentration of the quantum dots 14a and the thickness T1 of the light converting layer 141 influence the conversion rate. As an example, the thickness T1 of the light converting layer 141 is, but not limited to, about 100 μm, and thus the light conversion may not be very high when the concentration of the quantum dots 14a is not high enough. The intensity of the sum of the intensity OLB$^{++}$ and the intensity CLG is approximately equal to the intensity ILB, wherein the intensity OLB$^{++}$ is greater than the intensity CLG in this exemplified variant embodiment.

The display device is not limited to the aforementioned embodiment, and may have other different variant embodiments or embodiments. To simplify the description, the identical components in each of the following variant embodiments or embodiments are marked with identical symbols. For making it easier to compare the difference between the first embodiment and the variant embodiment and the difference between the first embodiment and other embodiments, the following description will detail the dissimilarities among different variant embodiments or embodiments and the identical features will not be redundantly described.

Figure 5:
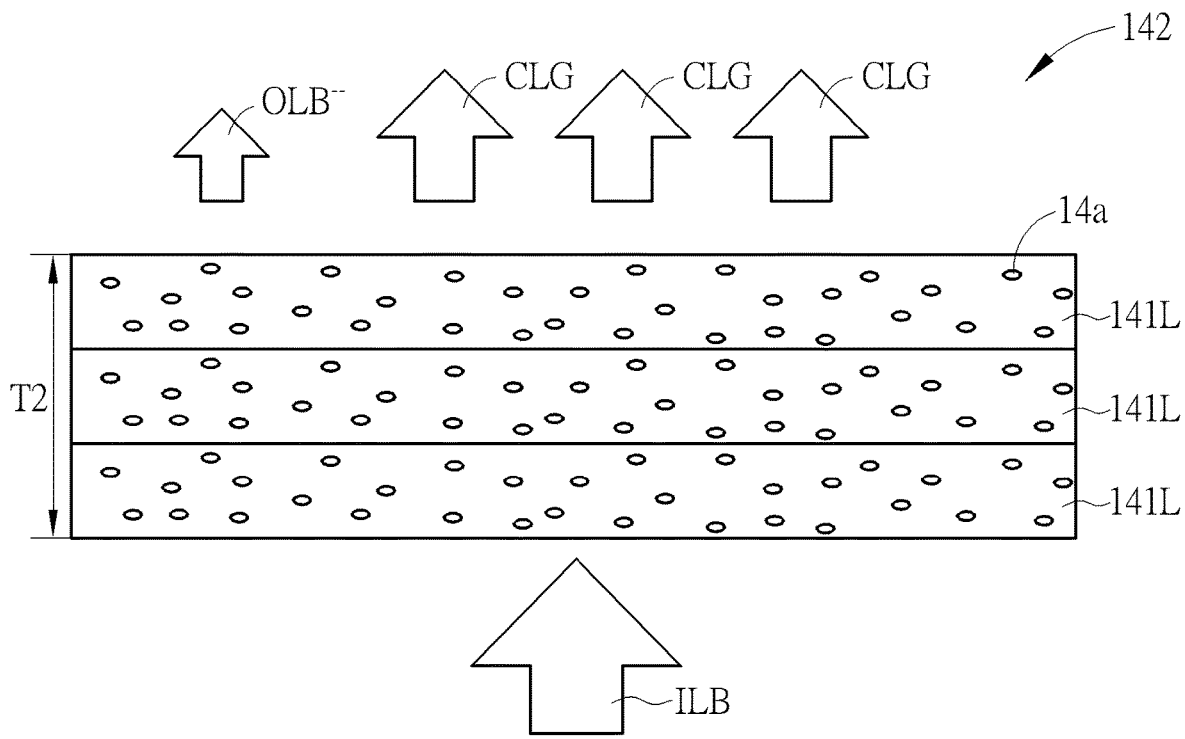
FIG. 5 is a sectional-view schematic diagram of a second exemplified variant of the light converting layer according to the first embodiment of the present disclosure.

Referring to FIG. 5, FIG. 5 is a sectional-view schematic diagram of a second exemplified variant of the light converting layer according to the first embodiment of the present disclosure. As compared with the first exemplified variant embodiment shown in FIG. 4, the light converting layer 142 may include a multilayer structure. Specifically, the multilayer structure may include a plurality of quantum dot layers 141L stacked in sequence, in which each quantum dot layer 141L includes a plurality of quantum dots 14a. In this example, one or more of the quantum dot layers 141L are the same as the light converting layer 141 shown in FIG. 4. The thickness T2 of the first light converting layer 142 may be adjusted by the number of the quantum dot layers 141L and therefore is greater than the thickness T1 of the light converting layer 141. By adjusting the number of the quantum dot layers 141L, the first ratio mentioned above may be adjusted accordingly. As shown in FIG. 5, since the light converting layer 142 includes, but not limited to, three quantum dot layers 141L as an example, the green converted light in the output light has a total intensity three times the intensity CLG, while the intensity $OLB^{--}$ of the blue-light leakage is much less than the outputted green light and much less than the intensity $OLB^{++}$ in FIG. 4. In addition, the thickness T2 is about 300 μm for instance.

Figure 6:
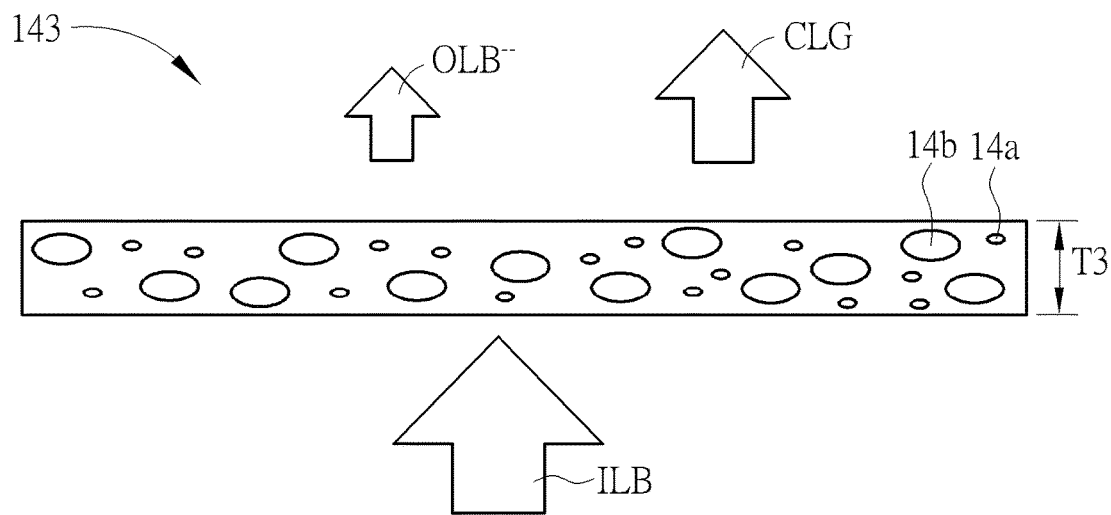
FIG. 6 is a sectional-view schematic diagram of a third exemplified variant of the light converting layer according to the first embodiment of the present disclosure.

Refer to FIG. 6, which is a sectional-view schematic diagram of a third exemplified variant of the light converting layer according to the first embodiment of the present disclosure. As compared with the first exemplified variant embodiment, the light converting layer 143 of this variant embodiment may further include at least one pigment material. Specifically, the light converting layer 143 may include a plurality of pigment particles 14b which can filter and absorb light of a specific wavelength range. Accordingly, through the pigment particles 14b, the first intensity integral I1 shown in FIG. 2 may be changed or reduced, so as to adjust or lower the first ratio. In other words, because of the pigment particles 14b, the thickness T3 of the light converting layer 143 may be less than the thickness T2 in the second exemplified variant embodiment while maintaining the same intensity $OLB^{--}$ of the blue-light leakage, or even maintaining the similar first ratio to the second exemplified variant embodiment. For example, the thickness T3 may be, but not limited to, 100 μm. Depending on the characteristic of the pigment material of the pigment particles 14b, the first intensity peak PK1 of the first wave W1 may be slightly changed or not. A size of each of pigment particles 14b, for example 50 nm, is greater than the size of each quantum dot 14a, but not limited thereto. It should be noted that the pigment materials or pigment particles 14b mentioned in this description may represent any material that can filter light or absorb light in specific range of light wavelength, such as dye or stain.

Figure 8:
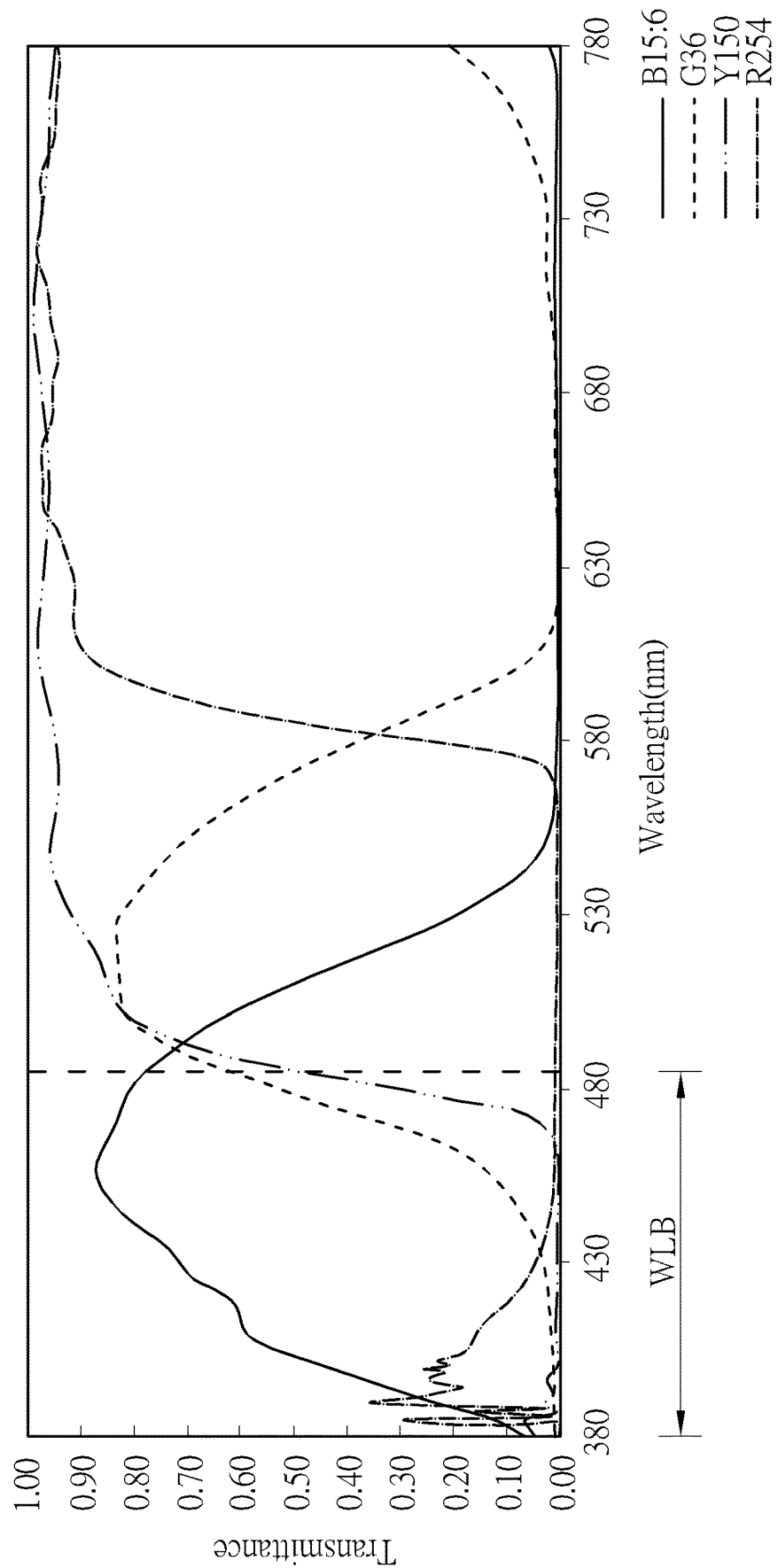
FIG. 8 is a filtering spectrum diagram of various pigments.

Referring to FIG. 8, FIG. 8 is a filtering spectrum diagram of various pigments, which illustrates the filtering spectrums of yellow pigment Y150, green pigment G36, red pigment R254, and blue pigment B15:6. Since the wavelength of blue light is in a range from 380 to 489 nm, shown as the range WLB in the figure, suitable pigment materials with suitable concentration may be selected especially according to their filtering spectrums in the range WLB in order to adjust the absorption rate or intensity of blue-light leakage. For example, the transmittance of the yellow pigment Y150 is about 0.00 when the wavelength is less than 465 nm, thus it can effectively absorb the blue input light with a main intensity at 448 nm. In another aspect, the transmittance of the blue pigment B15:6 in the wavelength range from 430 nm to 470 nm is not reach to 1.00, and therefore the blue pigment B15:6 may be used for slightly absorbing the blue input light. Accordingly, one or more kind of pigments may be adopted and doped in the light converting layer 143, based on the required first ratio and second ratio mentioned above.

Figure 7:
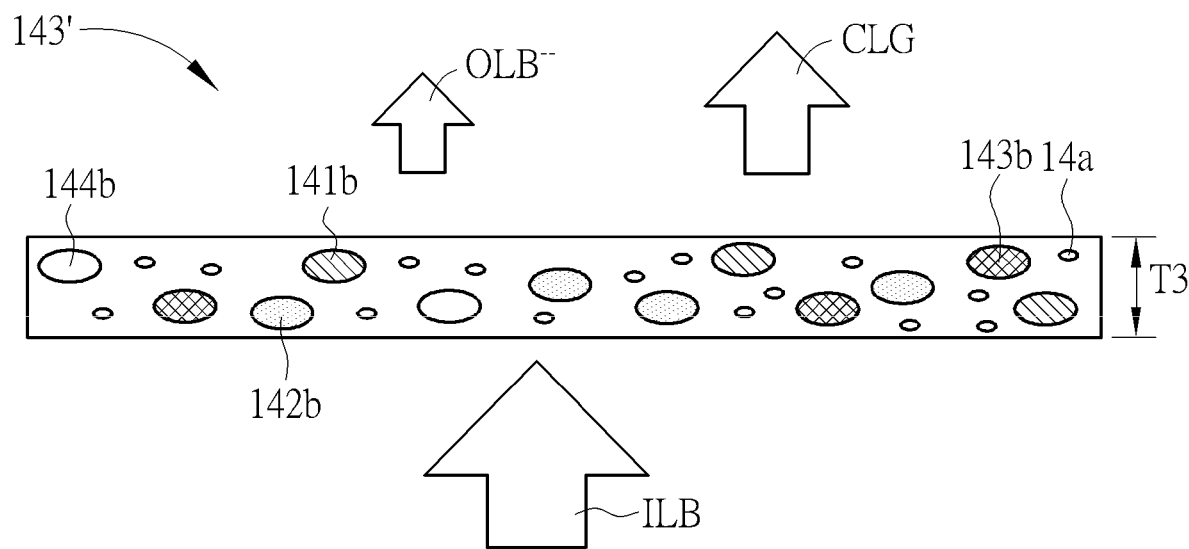
FIG. 7 is a sectional-view schematic diagram of a variant example of the third exemplified variant of the light converting layer shown in FIG. 6.

Referring to FIG. 7, FIG. 7 is a sectional-view schematic diagram of a variant example of the third exemplified variant of the light converting layer shown in FIG. 6. In this variant example, the light converting layer 143' may include quantum dots 14a and plural kinds of pigments 141b, 142b, 143b, 144b, such as blue pigment B15:6, yellow pigment Y150, red pigment R254, and green pigment G36 respectively, but not limited thereto. The pigments in the light converting layer 143' may include two or more pigment materials, wherein these pigment materials may be selected from the above-mentioned materials or any other suitable material.

In another variant example, the light converting layer 143' may include multiple quantum dot layers doped with plural kinds of pigment materials, wherein the different kinds of pigment materials may be doped separately in different quantum dot layers or in the same quantum dot layers. In still another variant example, the light converting layer 143' may include multiple quantum dot layers with one kind of pigment material which is doped in one or more layers among the quantum dot layers.

Figure 9:
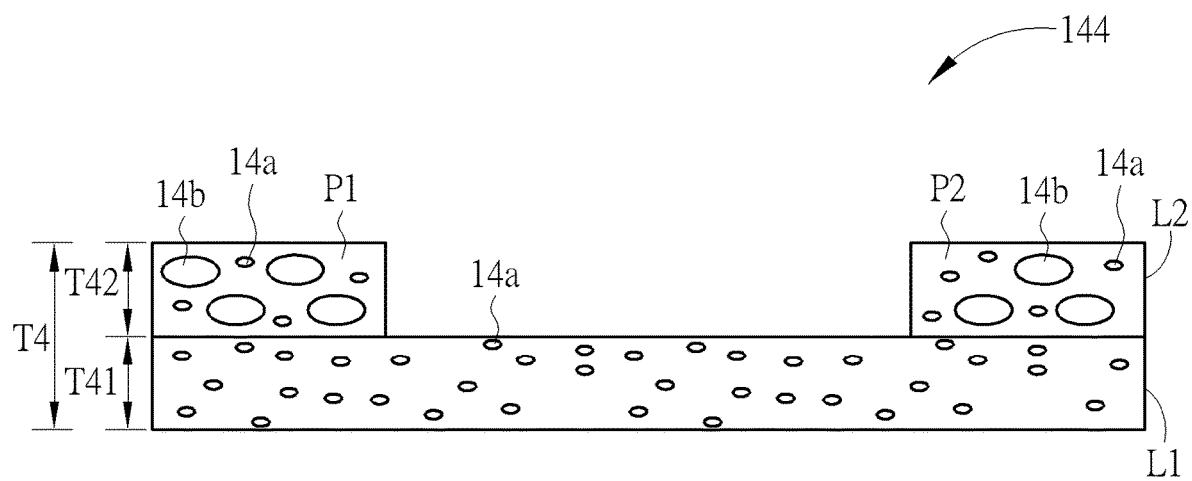
FIG. 9 is a sectional-view schematic diagram of a fourth exemplified variant of the light converting layer according to the first embodiment of the present disclosure.

Referring to FIG. 9, which is a sectional-view schematic diagram of a fourth exemplified variant of the light converting layer according to the first embodiment of the present disclosure. The light converting layer 144 may include a first light-converting part L1 and a second light-converting part L2, and the second light-converting part L2 is disposed (stacked) on the first light-converting part L1, in which the first light-converting part L1 includes a quantum dot material (shown as the quantum dots 14a), and the second light-converting part L2 includes at least one pigment material. In this exemplified variant embodiment, the second light-converting part L2 doesn't completely cover the first light-converting part L1, and the second light-converting part L2 may include a plurality of portions P1, P2 separated from each other. Therefore, in the cross-section view, the width of the second light-converting part L2 is less than the width of the first light-converting part L1 in the light converting layer 144. The portions P1, P2 includes a plurality of quantum dots 14a and a plurality of pigment particles 14b respectively. For example, the portions P1, P2 may be disposed near or on the edges of the first light-converting part L1 respectively. It should be noted that the pigment particles 14b in the portion P1 and the portion P2 may be different or the same, and the pigment particles 14b may include only one pigment material or include multiple pigment materials. In another variant embodiment, the portion P1 and portion P2 may not include the quantum dots 14a. In addition, the total thickness T4 of the light converting layer 144 is the sum of the thickness T41 of the first light-converting part L1 and the thickness T42 of the second light-converting part L2, wherein the thickness T41 and the thickness T42 may be about 100 μm respectively, thus the total thickness T4 is about 200 μm and less than the thickness T2 shown in FIG. 5. In another variant embodiment, the thickness T41 and the thickness T42 may be about 50 μm respectively, thus the total thickness T4 is approximately equal to the thickness T1 shown in FIG. 4 while the light-converting layer 144 has less blue-light leakage than the light converting layer 141.

Figure 10:
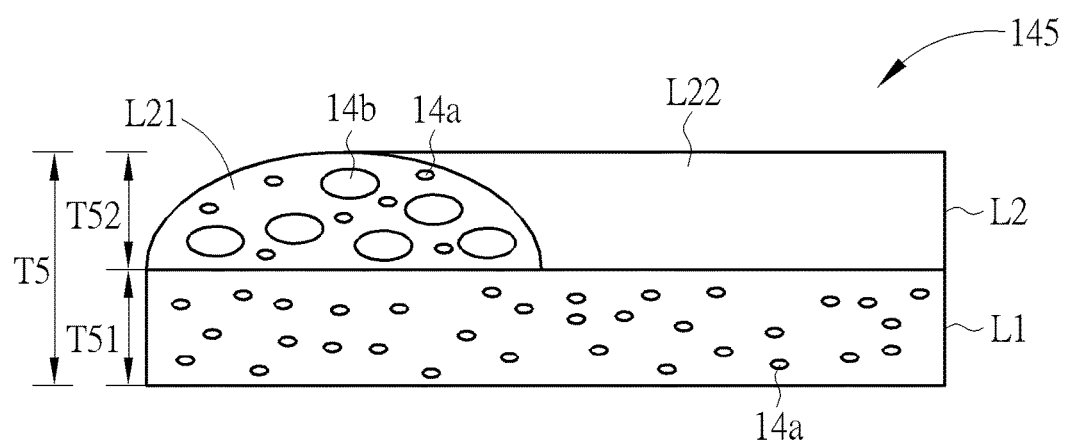
FIG. 10 is a sectional-view schematic diagram of a fifth exemplified variant of the light converting layer according to the first embodiment of the present disclosure.
Figure 11:
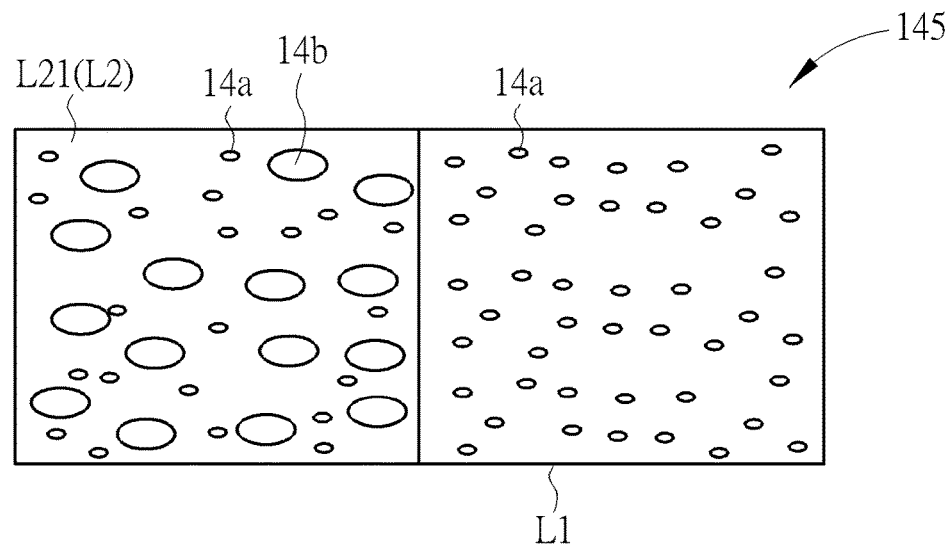
FIG. 11 is a top-view schematic diagram of the light converting layer shown in FIG. 10.

Referring to FIG. 10 and FIG. 11, FIG. 10 is a sectional-view schematic diagram of a fifth exemplified variant of the light converting layer according to the first embodiment of the present disclosure, and FIG. 11 is a top-view schematic diagram of the light converting layer shown in FIG. 10. Compared with the fourth exemplified variant embodiment, the second light-converting part L2 of the light converting layer 145 in this exemplified variant embodiment has a first portion L21 including quantum dots 14a and pigment particles 14b disposed on one side of the first light-converting part L1. The second light-converting part L2 may selectively further include a second portion L22 disposed (stacked) on the first light-converting part L1, the second portion L22 is adjacent to the first portion L21, and a combination of the first portion L21 and the second portion L22 covers the first light-converting part L1. A top surface of the first portion L21 may be leveled with a top surface of the second portion L22. The second portion L22 may include a transparent layer without pigment materials or quantum dots. In another variant embodiment, the pigment particles 14b may be formed of a plurality of pigment materials. In still another variant embodiment, the first portion L21 may not include the quantum dots 14a. In another variant embodiment, the first portion L21 of the second light-converting part L2 may not be stacked on the first light-converting part L1, but disposed aside the first light-converting part L1. In another variant embodiment, the light converting layer 145 may include a plurality of first light-converting parts L1 and a plurality of second light-converting parts L2, and the first light-converting parts L1 and the second light-converting parts L2 are alternately stacked. It should be noted that the arrangement and shape of the first portion L21 of the second light-converting part L2 is not limited to FIG. 11. For example, the first portion L21 may have a triangular shape or have in-continuous patterns. In addition, the total thickness T5 of the light converting layer 145 is the sum of the thickness T51 of the first light-converting part L1 and the thickness T52 of the second light-converting part L2, and the thickness T5 may be greater than or equal to the thickness T1 of the light converting layer 141 in FIG. 4 and less than the thickness T2 of the light converting layer 142 in FIG. 5.

Figure 12:
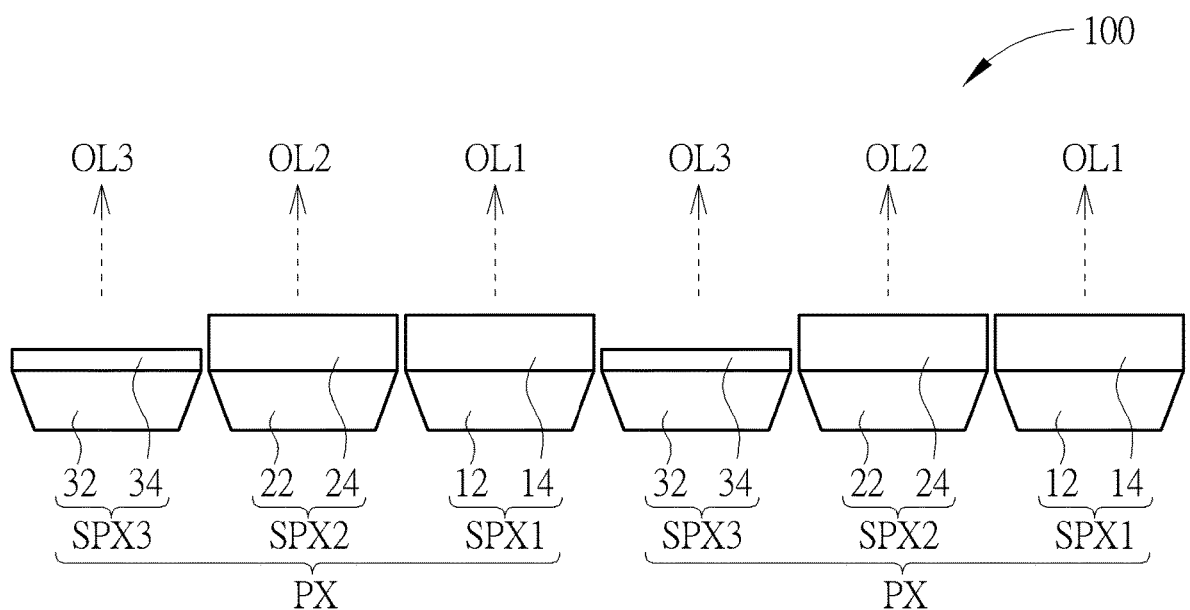
FIG. 12 is a sectional-view schematic diagram illustrating a display device according to a second embodiment of the present disclosure.

The above-mentioned display device 10 may be used as a display cell in a sub-pixel of a color display device. Refer to FIG. 12, which is a sectional-view schematic diagram illustrating a display device according to a second embodiment of the present disclosure. The display device 100 is a color display device and may include a plurality of pixels PX, and each pixel PX may include two or more sub-pixels for outputting different color lights. In this embodiment, the pixel PX includes three sub-pixels, and one of the three sub-pixels in one pixel PX may be a green sub-pixel SPX1 that uses the display cell including the elements in the display device 10 mentioned above in the first embodiment or its related exemplified variant or variant embodiments. Specifically, the green sub-pixel SPX1 may include the light emitting unit 12 and the light converting layer 14 so as to generate the first output light OL1 with the green output color close to the green primary color of DCI-P3 color gamut that meets the requirements. Wherein, the first output light OL1 has an above-defined first ratio greater than 0% and less than or equal to 7.5%. Selectively, the first output light OL1 has an above-defined second ratio greater than 0% and less than or equal to 10.0%. The other two sub-pixels of the same pixel PX may respectively be a red sub-pixel SPX2 and a blue sub-pixel SPX3, but not limited thereto. The red sub-pixel SPX2 may include a second light emitting unit 22 and a second light converting layer 24 disposed on the second light emitting unit 22. For example, the second light emitting unit 22 may be the same as the light emitting unit 12, which is a blue LED, but not limited thereto, and the second light converting layer 24 may include a quantum dot material, a color filter material or a phosphor material. The second light converting layer 24 can be used to absorb the light generated from the second light emitting unit 22 and generate another converted light, so that a second output light OL2 can be emitted from the second light converting layer 24. As compared with the light converting layer 14, the converted light generated from the second light converting layer 24 is red. For example, the peak wavelength of the second light converting layer 24 may range from 633 nm to 639 nm, and when the second light converting layer 24 includes quantum dots, the size of each quantum dot may be for example from 4 to 6 nm, but not limited thereto. Also, in order to emit red light, the second light converting layer 24 should absorb most of or all of the input light, so that the color of the output light OL2 from the second converting layer 24 can be close to or the same as the red primary color of DCI-P3 color gamut.

Additionally, the blue sub-pixel SPX3 may include a third light emitting unit 32. For example, the third light emitting unit 32 may be the same as the light emitting unit 12, which is a blue LED, but not limited thereto. When the third light emitting unit 32 meets the requirements, the blue sub-pixel SPX3 may not include light converting layer. However, the blue sub-pixel SPX3 may selectively include a third light converting layer 34 disposed on the third light emitting unit 32 in order to meet some requirements. The third light converting layer 34 may include a quantum dot material, a color filter material or a phosphor material. The third light converting layer 34 can also be used to change the blue light of the third light emitting unit 32 to be close to the blue primary color of the DCI-P3 color gamut. For example, when the third light converting layer 34 is formed of the quantum dots, the size of each quantum dot may range from 2 nm to 3 nm. Also, the intensity peak of the converted light of the third light converting layer 34 may range from 447 nm to 449 nm. The thickness of the third light converting layer 34 may be less than the thickness of the light converting layer 14 and the thickness of the second light converting layer 24. It will be understood that the display device 100 may further include other display elements, such as data lines, scan lines, TFTs, electrodes, substrates, polarization layers, optical films, insulating layers, encapsulation layers, or other elements or layers. The display unit may include at least a portion of elements or layers, for example the red sub-pixel SPX1 may include the first light emitting unit 12, the first light converting layer 14, and a portion of a corresponding polarization layer. The shift effect of first ratio, second ratio, and color hue (x-coordinate value, y-coordinate value) by those elements and layers may be ignorable, and the dominant effective factor are the light emitting unit and the light converting layer. The output light could be regarded as the final visual light of the display device to the user (observer).

Figure 13:
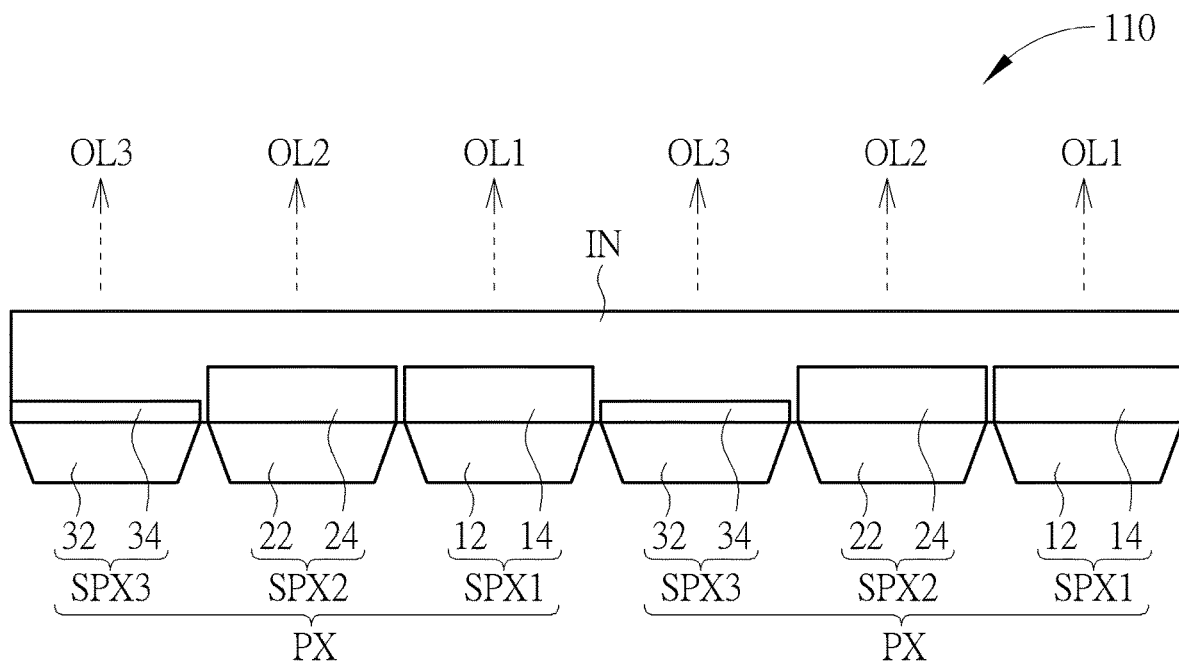
FIG. 13 is a sectional-view schematic diagram illustrating a display device according to a variant embodiment of the second embodiment of the present disclosure.

Refer to FIG. 13, which is a sectional-view schematic diagram illustrating a display device according to a variant embodiment of the second embodiment of the present disclosure. As compared with the second embodiment, the display device 110 of this variant embodiment further includes an insulation layer IN covering the pixels PX. The insulation layer IN may be formed of an organic material, such as photoresist material, or an inorganic material, such as silicon nitride or silicon oxide. When the insulation layer IN is formed of organic material, it may be easy to flatten the top surface of the insulation layer IN. When the insulation layer IN is formed of inorganic material, the insulation layer IN may have better resistance, which helps to apply to touch devices. In another variant embodiment, the insulation layer IN may be formed of a multilayer structure, and the multilayer structure may be a stack of the organic material and the inorganic material.

Figure 14:
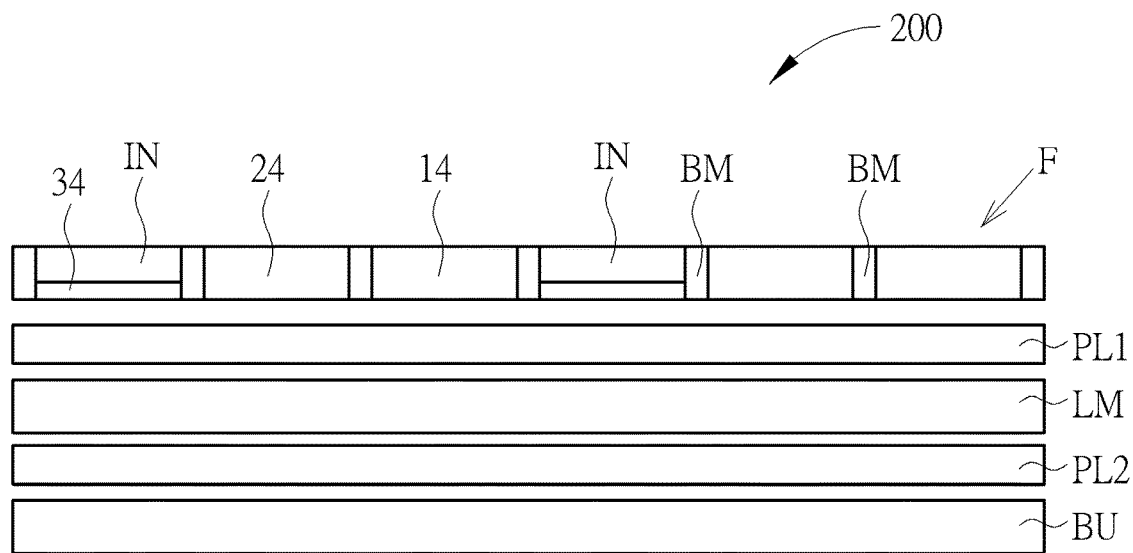
FIG. 14 is a sectional-view schematic diagram illustrating a display device according to a third embodiment of the present disclosure.

Refer to FIG. 14, which is a sectional-view schematic diagram illustrating a display device according to a third embodiment of the present disclosure. As shown in FIG. 14, the display device 200 may include a backlight unit BU, a light modulating layer LM, a first light converting layer 14 and a first polarization layer PL1. The light modulating layer LM may be for example a liquid crystal layer or a liquid crystal panel used for modulating the liquid crystal of the sub-pixels to different refractive states. It will be understood that the display device 200 may further include other display elements, such as data lines, scan lines, TFTs, substrates, optical films, insulating layers, encapsulation layers, or other elements to control the switches of the pixels. Specifically, the display device 200 may include a film F which includes a plurality of the first light converting layers 14, a plurality of the second light converting layers 24 and a plurality of selective third light converting layers 34 mentioned above. The first light converting layers 14, the second light converting layers 24 and the third light converting layers 34 may be arranged alternately, and a black matrix BM may be further disposed between any two adjacent light converting layers. In other words, the first light converting layers 14, the second light converting layers 24, the third light converting layers 34 and the black matrix BM may form the film F. In other embodiments, the black matrix BM could be replaced by stacked light converting layers, or there is no black matrix BM. In this embodiment, the film F is disposed on the backlight unit BU, and the first polarization layer PL1 and the light modulating layer LM is disposed between the backlight unit BU and the film F, in which the first polarization layer PL1 is disposed between the light modulating layer LM and the first light converting layer 14. The display device 200 may further include a second polarization layer PL2 disposed between the light modulating layer LM and the backlight unit BU, so that the light modulating layer LM is disposed between the first polarization layer PL1 and the second polarization layer PL2. The input light emitted from the backlight unit BU can be converted into output lights respectively by the first light converting layers 14, the second light converting layers 24 and the third light converting layers 34. The backlight unit BU may generate the input light the same as the input light of the first embodiment. For example, the backlight unit BU may include one or a plurality of light emitting units 12 of the first embodiment. In the embodiment, a display unit may include a light emitting unit (a portion of the corresponding backlight unit BU), a portion of the corresponding light modulating layer LM, and a portion of the polarization layer(s). The shift effect of first ratio, second ratio, and color hue (x-coordinate value, y-coordinate value) by those elements and layers may be ignorable, and the dominant effective factor are the backlight unit and the light converting layer. The output light could be regarded as the final visual light of the display device to the user (observer).

Figure 15:
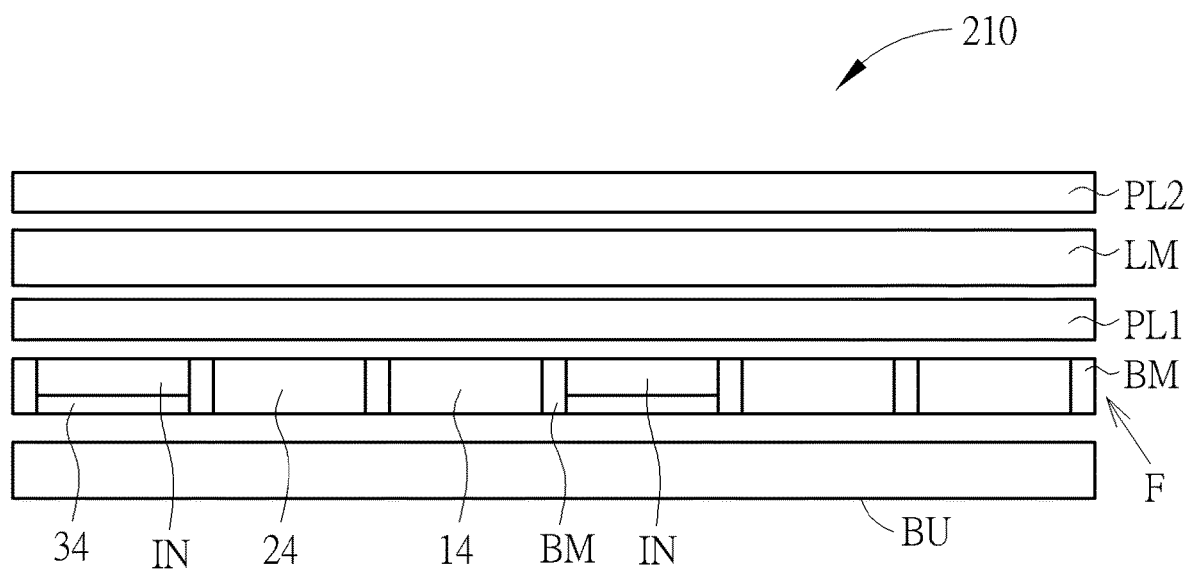
FIG. 15 is a sectional-view schematic diagram illustrating a display device according to a variant embodiment of the third embodiment of the present disclosure.

Refer to FIG. 15, which is a sectional-view schematic diagram illustrating a display device according to a variant embodiment of the third embodiment of the present disclosure. As shown in FIG. 15, as compared with the third embodiment, in the display device 210 of this variant embodiment, the film F including the light converting layers 14, the second light converting layers 24 and the selective third light converting layers 34 is disposed between the backlight unit BU and the light modulating layer LM. The first polarization layer PL1 is disposed between the film F and the light modulating layer LM, and the light modulating layer LM is disposed between the second polarization layer PL2 and the backlight unit BU. In the embodiment, a display unit may include a light emitting unit (a portion of the corresponding backlight unit BU), a portion of the corresponding light modulating layer LM, and a portion of the polarization layer(s). The shift effect of first ratio, second ratio, and color hue (x-coordinate value, y-coordinate value) by those elements and layers may be ignorable, and the dominant effective factor are the backlight unit and the light converting layer. The output light could be regarded as the final visual light of the display device to the user (observer).

It should be noted that the technical features in different embodiments of the present disclosure can be combined, replaced, or mixed with one another to constitute another embodiment.

In summary, the first ratio and second ratio defined above can be adjusted easily by the thickness or the doped materials of the light converting layer to be greater than 0% and less than or equal to 7.5% in the display device of the present disclosure. In another aspect, the number of the light-converting parts included in the light converting layer, the arrangements, shapes or areas of the light-converting parts, the concentrations, the sizes, or the materials of the quantum dots or the pigment materials may also influence the above-mentioned first ratio and second ratio according to the present disclosure. As a result, the color temperature of the display device can be easily adjusted to be similar to the color temperature generated from the TV, thereby improving the visual perception of the user and saving the manufacturing cost.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. An electronic device, comprising:
a light emitting diode; and
a light converting layer disposed on the light emitting diode,
wherein the electronic device emits a green output light under an operation of a highest brightness, the green output light has an output spectrum, an intensity integral of the output spectrum from 380 nm to 489 nm is defined as a first intensity integral, an intensity integral of the output spectrum from 490 nm to 780 nm is defined as a second intensity integral, a ratio of the first intensity integral over the second intensity integral is defined as a first ratio, and the first ratio is greater than 0% and less than or equal to 7.5%.

2. The display device of claim 1, wherein the light converting layer comprises a quantum dot material, a color filter material, or a phosphor material.

3. The electronic device of claim 1, wherein the output spectrum comprises a first intensity peak between 380 nm to 489 nm, a second intensity peak between 490 nm to 780 nm and a third intensity peak between 380 nm to 489 nm, wherein an intensity of the third intensity peak is less than an intensity of the first intensity peak.

4. The electronic device of claim 1, wherein the light emitting diode emits blue light.

5. The electronic device of claim 1, wherein the light converting layer comprises a multilayer structure.

6. The electronic device of claim 1, wherein the light converting layer comprises a first light-converting part and a second light-converting part disposed on the first light-converting part, wherein the first light-converting part comprises a quantum dot material, and the second light-converting part comprises at least one pigment material.

7. An electronic device, comprising:
a light emitting diode; and
a light converting layer disposed on the light emitting diode,
wherein the electronic device emits an output light under an operation of a highest brightness, the output light has an output spectrum, the output spectrum comprises a first intensity peak and a second intensity peak, the first intensity peak is a maximum peak of the output spectrum between 380 nm to 489 nm, the second intensity peak is a maximum peak of the output spectrum between 490 nm to 780 nm, a ratio of the first intensity peak over the second intensity peak is defined as a second ratio, and the second ratio is greater than 0% and less than or equal to 10.0%.

8. The electronic device of claim 7, wherein the light converting layer comprises a quantum dot material, a color filter material, or a phosphor material.

9. The electronic device of claim 7, wherein the output spectrum comprises a third intensity peak between 380 nm to 489 nm, wherein an intensity of the third intensity is less than an intensity of the first intensity peak.

10. The electronic device of claim 7, wherein the light emitting diode emits blue light.

11. The electronic device of claim 7, wherein the light converting layer comprises a multilayer structure.

12. The electronic device of claim 7, wherein the light converting layer comprises a first light-converting part and a second light-converting part disposed on the first light-converting part, wherein the first light-converting part comprises a quantum dot material, and the second light-converting part comprises at least one pigment material.

* * * * *